(12) United States Patent
Hiramatsu et al.

(10) Patent No.: US 9,954,146 B2
(45) Date of Patent: Apr. 24, 2018

(54) PHOSPHOR, MANUFACTURING METHOD THEREOF, AND LIGHT-EMITTING DEVICE USING THE PHOSPHOR

(71) Applicants: KABUSHIKI KAISHA TOSHIBA, Tokyo (JP); TOSHIBA MATERIALS CO., LTD., Yokohama-shi (JP)

(72) Inventors: Ryosuke Hiramatsu, Yokohama (JP); Keiko Albessard, Yokohama (JP); Naotoshi Matsuda, Chigasaki (JP); Masahiro Kato, Naka (JP)

(73) Assignees: KABUSHIKI KAISHA TOSHIBA, Minato-ku (JP); TOSHIBA MATERIALS CO., LTD, Yokohama-shi (JP)

( * ) Notice: Subject to any disclaimer, the term of this patent is extended or adjusted under 35 U.S.C. 154(b) by 50 days.

(21) Appl. No.: 14/850,168

(22) Filed: Sep. 10, 2015

(65) Prior Publication Data
US 2015/0380613 A1 Dec. 31, 2015

Related U.S. Application Data

(63) Continuation of application No. PCT/JP2014/054078, filed on Feb. 20, 2014.

(30) Foreign Application Priority Data

Mar. 15, 2013 (JP) .................... 2013-053503

(51) Int. Cl.
*H01L 33/50* (2010.01)
*C09K 11/61* (2006.01)

(52) U.S. Cl.
CPC .......... *H01L 33/502* (2013.01); *C09K 11/617* (2013.01); *H01L 33/504* (2013.01);
(Continued)

(58) Field of Classification Search
CPC .................... C09K 11/617; H01L 33/504
(Continued)

(56) References Cited

U.S. PATENT DOCUMENTS 7,358,542 B2 4/2008 Radkov et al.
8,057,706 B1* 11/2011 Setlur .................... C09K 11/02
252/301.4 F
(Continued)

FOREIGN PATENT DOCUMENTS

JP 2009-528429 8/2009
JP 2010-209311 9/2010
(Continued)

OTHER PUBLICATIONS

International Preliminary Report of Patentability and Written Opinion dated Sep. 24, 2015 in PCT/JP2014/054078 (English translation only).

(Continued)

*Primary Examiner* — Tuan Nguyen
(74) *Attorney, Agent, or Firm* — Oblon, McClelland, Maier & Neustadt, L.L.P.

(57) ABSTRACT

The present invention provides a red-light emitting phosphor having high luminous efficacy and also a manufacturing method thereof. The phosphor is a red-light emitting phosphor mainly comprising potassium fluorosilicate and having a basic surface composition represented by the formula (A): $K_a SiF_b$. The disclosed phosphor is characterized by being activated by manganese and also characterized in that the amount of manganese on the surface is not more than 0.2 mol % based on the total amount of all the elements on the surface. This phosphor can be manufactured by washing with a weak acid a product obtained by placing a silicon source to react in contact with a reaction solution containing potassium permanganate.

17 Claims, 6 Drawing Sheets (52) U.S. Cl.
CPC ............... *H01L 2224/16145* (2013.01); *H01L 2224/48091* (2013.01); *H01L 2224/73265* (2013.01); *H01L 2924/181* (2013.01)

(58) Field of Classification Search
USPC ........................................................ 257/98
See application file for complete search history.

(56) References Cited

U.S. PATENT DOCUMENTS

| | | | |
|---|---|---|---|
| 2010/0142189 A1 | 6/2010 | Hong et al. | |
| 2012/0056209 A1* | 3/2012 | Mitsuishi | C09K 11/0883 257/88 |
| 2013/0229106 A1* | 9/2013 | Mitsuishi | C09K 11/0883 313/503 |
| 2013/0234585 A1* | 9/2013 | Albessard | C09K 11/7734 313/503 |

FOREIGN PATENT DOCUMENTS

| | | |
|---|---|---|
| JP | 2011-012091 | 1/2011 |
| JP | 2012-224536 A | 11/2012 |
| JP | 2013-014715 | 1/2013 |
| JP | 2013-533363 A | 8/2013 |
| TW | 201437331 A | 10/2014 |
| TW | 201538684 A | 10/2015 |
| WO | WO 2007-100824 | 9/2007 |
| WO | 2009/119486 A1 † | 10/2009 |
| WO | WO 2009-0119486 * | 10/2009 |
| WO | WO 2009-119486 | 10/2009 |
| WO | WO 2012/015581 A1 | 2/2012 |

OTHER PUBLICATIONS

Office Action dated Nov. 25, 2014 in Taiwanese Application No. 103105650 filed Feb. 20, 2014 (with English translation).
Office Action dated May 8, 2015 in Taiwanese Application No. 103105650 filed Feb. 20, 2014 (with English translation).
International Search Report dated Apr. 22, 2014 in PCT/JP2014/054078 filed Feb. 20, 2014.
Toru Takahashi et al. "Synthesis of K2SiF6:Mn4+ Red Phosphor from Silica Glasses by Wet Chemical Etching in HF/KMnO4 Solution" Electrochemical and Solid-State Letters, 12 (8) J69-J71 (2009).

\* cited by examiner
† cited by third party

PHOSPHOR, MANUFACTURING METHOD THEREOF, AND LIGHT-EMITTING DEVICE USING THE PHOSPHOR

CROSS-REFERENCE TO RELATED APPLICATIONS

This application is based upon and claims the benefit of priorities from the Japanese Patent Application No. 2013-053503, filed on Mar. 15, 2013, and the International Patent Application No. PCT/JP2014/054078, filed on Feb. 20, 2014, the entire contents of which are incorporated herein by reference.

FIELD

The present disclosure relates to a phosphor, a method for manufacturing the phosphor, and a light-emitting device using the phosphor.

BACKGROUND

An LED light-emitting device mainly comprises a combination of a phosphor and an LED chip serving as an excitation light source, and can realize various colors of emission light according to the combination.

Specifically, a white LED light-emitting device, which radiates white emission light, comprises a phosphor in combination with an LED chip that emits light in the blue region. For example, the device comprises a phosphor mixture and an LED chip giving off blue light. In practice, a phosphor emitting yellow light, which is complementary to blue light, is often adopted as the phosphor to produce a pseudo-white LED light-emitting device. Further, a three-wavelength white LED device is also developed which comprises a LED chip emitting blue light, a green- or yellow-light emitting phosphor and a red-light emitting phosphor. As an example of the red-light emitting phosphor used in that light-emitting device, $K_2SiF_6$:Mn phosphor is known.

DETAILED DESCRIPTION

The red-light emitting phosphor according to an embodiment of the present disclosure comprises potassium fluorosilicate as a major ingredient and has a basic surface composition represented by the formula (A): $K_aSiF_b$ (A) in which a and b are numbers satisfying the conditions of $1.5 \leq a \leq 2.5$ and $5.5 \leq b \leq 6.5$, respectively. This phosphor is activated by manganese and the amount of manganese in on the surface of the phosphor is not more than 0.2 mol % based on the total amount of all the elements on the surface.

Further, the method according to another embodiment of the present disclosure for manufacturing the above phosphor comprises the steps of preparing a reaction solution consisting of an aqueous solution containing potassium permanganate and hydrogen fluoride, immersing a silicon source to react in said reaction solution, separating and then washing a formed phosphor with a weak acid, and subjecting the washed phosphor to rinse treatment.

Furthermore, the light-emitting device according to still another embodiment of the present disclosure comprises a light-emitting element radiating light in the wavelength range of 440 to 470 nm inclusive, and a phosphor layer containing the above phosphor.

The following is a detailed description of embodiments of the present disclosure.

Embodiments of the present disclosure will now be explained below. However, it is noted that the embodiments described below are provided only to illustrate phosphors or light-emitting devices embodying the technical concept of the present disclosure, and hence the present disclosure is by no means limited to the following examples.

Further, this specification is not intended to restrict the members or components mentioned in the claims to the described embodiments. In particular, the sizes, materials, shapes, arrangement and the like of the components described in the embodiments are intended not to limit the scope of the present disclosure but to provide merely illustrative examples. Incidentally, the sizes and positional relationship of the members shown in the drawings may be exaggerated for the purpose of clarifying the explanation. The same names or same reference numbers in the drawings indicate the same or equivalent members or components, and hence detailed description thereof will be omitted. Some of the components constituting the present embodiments may be so integrated into one member that the member may function as the plural components, and on the contrary some members may share the function of one component.

The applicant has intensively researched and studied phosphors mainly comprising potassium fluorosilicate activated by manganese, and finally found that there is a relation between the surface composition and the luminous properties in those phosphors.

The red-light emitting phosphor according to the embodiment mainly comprises potassium fluorosilicate activated by manganese. Here, the "mainly comprises potassium fluorosilicate" means that the phosphor has a basic crystal structure of potassium fluorosilicate but that the elements constituting the crystal structure are partly replaced with other elements. This phosphor contains a small amount of manganese on the surface, which has a basic composition represented by the following formula (A): $K_aSiF_b$ (A). In the formula, a and b are numbers satisfying the conditions of:

$1.5 \leq a \leq 2.5$, preferably $1.8 \leq a \leq 2.3$, and $5.5 \leq b \leq 6.5$, preferably $5.7 \leq b \leq 6.2$, respectively.

The amount of manganese on the surface of the phosphor is not more than 0.2 mol %, preferably not more than 0.1 mol % based on the total amount of all the elements on the surface of the phosphor.

The values of a and b need to be in the above ranges so that the phosphor can exhibit excellent luminous efficacy.

On the other hand, however, the composition as a whole of the phosphor according to the embodiment is preferably represented by the following formula (B):

$$K_c(Si_{1-x}Mn_x)F_d \qquad (B).$$

In the formula, c, d and x are numbers satisfying the conditions of $1.5 \leq c \leq 2.5$, preferably $1.8 \leq c \leq 2.2$,
$5.5 \leq d \leq 6.5$, preferably $5.7 \leq d \leq 6.2$, and
$0 < x \leq 0.06$, preferably $0.01 \leq x \leq 0.05$, respectively.

The phosphor of the embodiment contains manganese as the activator. If not containing manganese (namely, in the case of x=0), the phosphor cannot be observed to emit luminescence even when excited by light having an emission peak in the blue to UV region. Accordingly, x in the formula (B) must be larger than 0. Further, x is preferably 0.01 or more because the luminous efficacy tends to be improved according as the manganese content increases. In addition, the valence of manganese is preferably +4 so as to obtain a phosphor emitting red luminescence.

On the other hand, however, if the manganese content is too high, the emission intensity of the phosphor tends to be lowered because of concentration quenching. The manganese content (x) is hence necessarily 0.06 or less, preferably 0.05 or less to avoid the quenching.

The content of each element in the phosphor can be analyzed, for example, in the following manner. For analyzing the metal elements such as K, Si and Mn, the synthesized phosphor is subjected to alkali fusion and then analyzed according to ICP emission spectroscopy by means of, for example, IRIS Advantage ICP spectrometer ([trademark], manufactured by Thermo Fisher Scientific Inc.). For analyzing the non-metal element F, the synthesized phosphor is subjected to thermal hydrolysis and then analyzed by means of, for example, DX-120 ion chromatograph system ([trademark], manufactured by Nippon Dionex K.K.). However, the element F can be analyzed by ion chromatography after the alkali fusion procedure is carried out in the same manner as the above metal elements.

Although stoichiometrically containing no oxygen, the phosphor according to the embodiment is often inevitably contaminated with oxygen by decomposition of the surface during or after the synthesizing process thereof. The oxygen content in the phosphor is ideally equal to zero, but in practice preferably satisfies the condition of:

[oxygen content]/[(fluorine content)+(oxygen content)]<0.05 because the luminous efficacy is not seriously lowered under that condition.

Further, the phosphor of the embodiment may contain alkali metals, such as Na, Rb and Cs, and other elements, such as Ti, Ge and Sn, in small amounts. That is because the phosphor can show almost the same emission to achieve the desired effect even if containing those elements in small amounts. However, in view of stability of the phosphor and reactivity in the manufacturing process thereof, their contents are preferably small. In addition, if those elements are intended to be incorporated into the phosphor, it may be necessary to change the synthesizing procedures. Accordingly, it is preferred not to use metal elements other than the metals in the formula (B) so as to save the production cost.

The phosphor according to the embodiment is characterized in that a small amount of manganese is distributed on the surface. Here, the "surface" means not only the bare superficial face but also an area within a depth of tens of nanometers under the superficial face. The composition on the surface of the phosphor can be measured by XPS (X-ray photoelectron spectroscopy).

The XPS measurement is a technique in which the sample is exposed to an X-ray and then photoelectron energy emitted therefrom is measured. The photoelectrons emitted from deep inside of the sample are not detected because they are not scattered in the sample, and therefore the state only around the surface can be evaluated. This is the reason why the XPS measurement can detect the surface state within a depth of a few to tens of nanometers.

Specifically, the XPS measurement can be carried out by means of, for example, an XPS instrument Quantum 2000 ([trademark], manufactured by ALVAC-PHI Inc.). The measurement conditions may be changed according to the kind of the objected phosphor, the particle shape thereof and the like, but are, for example, as follows:

X-ray source: AlKα line, power: 40 W,
measuring area: φ 200 μm,
pass energy:
wide scan: 187.85 eV (1.60 eV/step)
narrow scan: 58.70 eV (0.125 ev/step),
charge neutralization gun: e⁻ in use with Ar⁺, and
takeoff angle: 45°.

Figure 1:
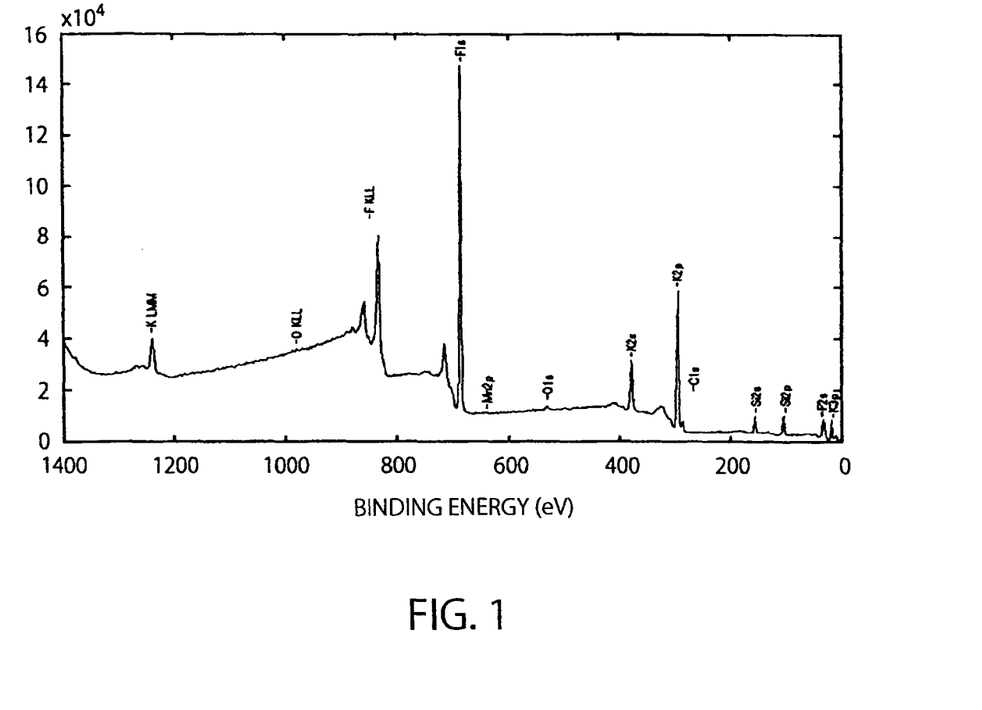
FIG. 1 shows an XPS spectrum of a phosphor according to an embodiment.
Figure 2:
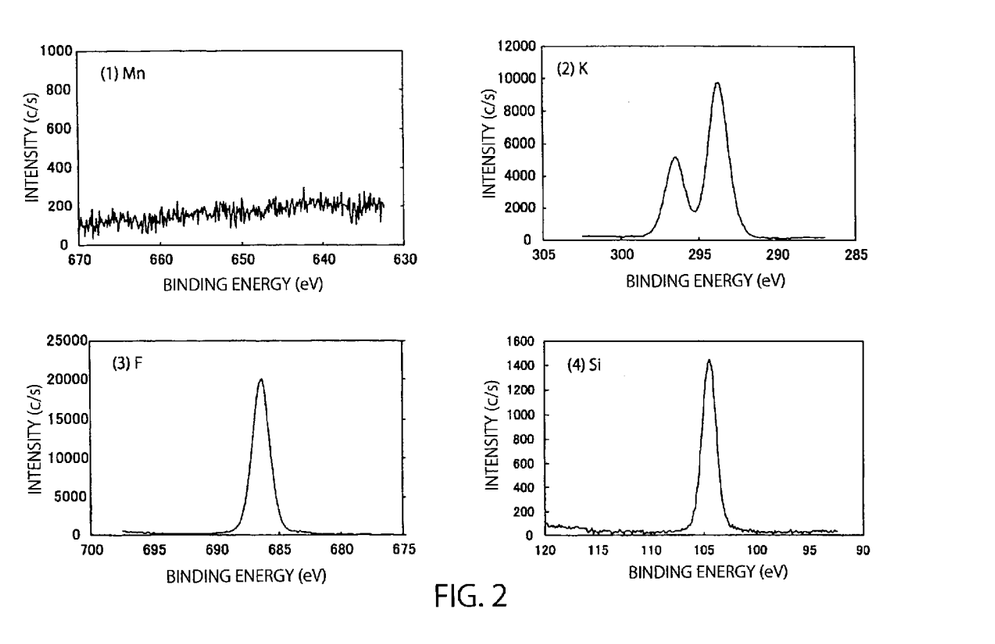
FIG. 2 shows XPS narrow-scan spectra of Mn, K, F and Si contained in the phosphor according to the embodiment.

The phosphor of the embodiment is subjected to the XPS measurement to obtain an XPS spectrum, from which the contained elements are assigned. As a result of the assignment, not only the constituting elements K, Si and F but also impurity elements such C and O are often found. The manganese Mn is not detected, or otherwise even if detected, it is contained in an amount of 0.2 mol % or less based on the total amount of all the elements in the phosphor surface. FIG. 1 shows an XPS wide-scan spectrum for qualititative analysis of the phosphor according to the embodiment, and FIG. 2 shows XPS narrow-scan spectra of Mn, K, F and Si detected in the phosphor of the embodiment. The Mn, K, F and Si contents can be individually obtained from the peak areas in the spectra thereof shown in FIG. 2.

The phosphor of the embodiment, in which the amount of Mn on the surface is 0.2 mol % or less based on the total amount of all the elements on the surface and also in which the surface has a basic composition represented by the formula (A), has been found by the present applicant to tend to have improved internal and external quantum efficiencies. In fact, the phosphor of the embodiment has an internal quantum efficiency of 60% or more.

The "external quantum efficiency (η)" here means a product value of the following absorptivity (α) and internal quantum efficiency (η'):

$$\text{absorptivity}(\alpha) = \frac{\int \lambda \cdot [E(\lambda) - R(\lambda)] d\lambda}{\int \lambda \cdot [E(\lambda)] d\lambda} \qquad (I)$$

$$\text{internal quantum efficiency}(\eta') = \frac{\int \lambda \cdot [P(\lambda)] d\lambda}{\int \lambda \cdot [E(\lambda) - R(\lambda)] d\lambda} \qquad (II)$$

$$\text{external quantum efficiency}(\eta) = \frac{\int \lambda \cdot [P(\lambda)] d\lambda}{\int \lambda \cdot [E(\lambda)] d\lambda} \qquad (III)$$

In the formulas,

E(λ): the whole spectrum of light emitted by the excitation light source onto the phosphor (in terms of the number of photons), R(λ): the spectrum of light emitted by the excitation light source but reflected by the phosphor (in terms of the number of photons), and P(λ): the emission spectrum of the phosphor (in terms of the number of photons).

As shown above, the external quantum efficiency can be obtained by (I)×(II).

The external quantum efficiency, internal quantum efficiency and absorptivity can be measured, for example, by means of C9920-02G absolute PL quantum yields measurement system ([trademark], manufactured by Hamamatsu Photonics K.K.). Those luminous characteristics can be measured by using blue light having a peak wavelength in about 440 to 460 nm with a half-width of 5 to 15 nm as the excitation light.

Figure 3:
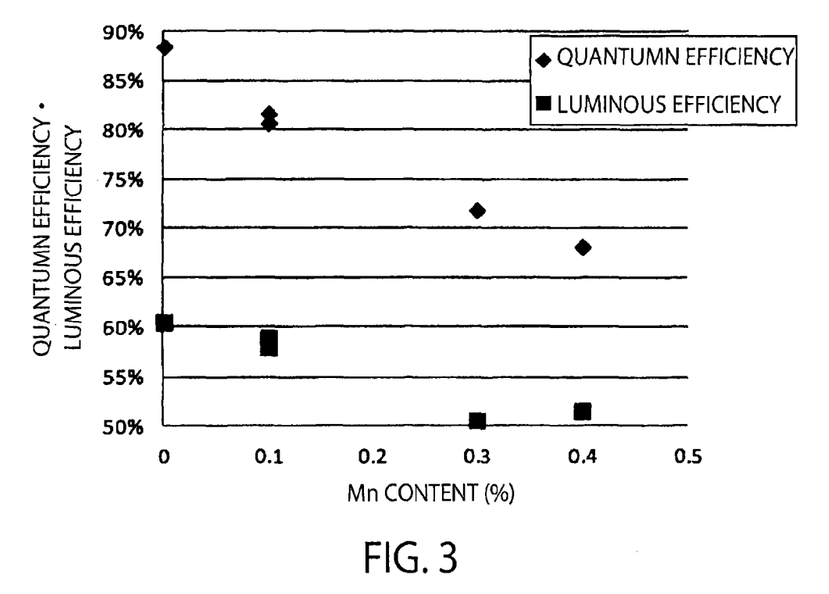
FIG. 3 shows a relation between the manganese content obtained by XPS measurement and external and internal quantum efficiencies.

FIG. 3 shows a relation between the manganese content detected by the XPS measurement and external and internal quantum efficiencies. It can be confirmed from the figure that the efficiencies, particularly, the internal quantum efficiency decreases according as the manganese content increases. According to the present applicant's study, it is also found that the efficiencies are lowered if the surface composition obtained by the XPS measurement is deviated from the formula (A).

The phosphor according to the embodiment can be manufactured, for example, in the following manner. The phosphor of the embodiment can be produced by a synthesizing method using potassium permanganate, and the method is characterized by comprising a washing step carried out after the synthesized phosphor is taken out.

First, an aqueous solution containing potassium permanganate ($KMnO_4$) and hydrogen fluoride (HF) is prepared as a reaction solution.

The reaction solution contains $KMnO_4$ and HF preferably in a molar ratio of 1/200 to 1/40, and the concentration of $KMnO_4$ is preferably 1 wt % or more. If they deviate from those ranges, the synthesized phosphor may exhibit poor external quantum efficiency and/or the reactivity may be so lowered that the phosphor cannot be synthesized in a sufficient amount and accordingly that the production cost may increase. In order to avoid those problems, the reaction solution in use needs to satisfy the above ranges.

The reaction can be generally conducted at a reaction temperature of 20 to 80° C. The optimal reaction temperature depends on the reaction time and the shape of the silicon source. However, the higher the reaction temperature is and the larger surface area the silicon source has, the shorter the optimal reaction time tends to be.

The reaction solution is then brought into contact with a material capable of serving as the silicon source. Normally, the silicon source is placed to react in the reaction solution. There are no particular restrictions on the reaction temperature, but the reaction is preferably conducted at a high temperature because the reaction efficiency tends to be improved at a high temperature. On the other hand, however, in view of the production cost, it is preferred not to increase the temperature too much.

There are no particular restrictions on the shape of the silicon source, but the silicon source is preferably not in the shape of fine powder because it is necessary to separate the phosphor formed on the surface of the silicon source as described below. Specifically, in order to isolate the phosphor from the silicon source, the volume of the silicon source is preferably larger than that of the phosphor. For example, the silicon source may be in the form of particles, plates or rods of 20000 times or more as large in volume as the phosphor. If the silicon source is very different in volume from the phosphor, it becomes possible to physically scrape off the phosphor crystal from the source surface or otherwise to separate and collect the phosphor crystal by use of a sieve after the phosphor crystal is peeled off from the silicon source by means of an ultrasonic vibrator. The silicon source is, for example, a silicon substrate such as a silicon wafer, granular amorphous silicon, or a silicon dioxide membrane formed on the surface of a silicon substrate.

Subsequently, the synthesized phosphor is taken out from the reaction solution, and then washed with an aqueous solution containing a weak acid. In the washing procedure, $KMnO_4$ attached on the surface of the phosphor is removed. According to the present applicant's study, this washing procedure improves the efficacy of the synthesized phosphor.

That is presumed to be because of the following reasons. The starting material $KMnO_4$ is ionized into $K^+$ and $MnO_4^-$ in an aqueous solution. The formed $MnO_4^-$ is known to change depending on pH of the solution. Specifically, if the pH is in an acidic range, $Mn^{2+}$ is formed according to the following reaction formula:

$$MnO_4^- + 8H^+ + 5e^- \rightarrow Mn^{2+} + 4H_2O.$$

On the other hand, if the pH is in a neutral range, $MnO_2$ is formed according to the following reaction formula:

$$MnO_4^- + 2H_2O + 3e^- \rightarrow MnO_2 + 4OH^-.$$

The $MnO_2$ formed by the above reaction has a black body color. Accordingly, if formed on the surface of the phosphor, $MnO_2$ is thought to absorb the luminescence of the phosphor and consequently to lower the internal quantum efficiency. In contrast, since the synthesized phosphor taken out from the reaction solution is successively washed with a weak acid aqueous solution in the method of the embodiment for manufacturing the phosphor, $KMnO_4$ attached on the surface of the phosphor is removed. As a result, the phosphor produced by the manufacturing method of the embodiment is presumed to have excellent properties.

It may be thought that $KMnO_4$ is removed by washing with a strong acid, such as, hydrochloric acid, nitric acid or sulfuric acid. However, if the phosphor is washed with a strong acid, $K_2SiF_6$ crystal serving as the phosphor matrix may be superficially dissolved to change the surface composition and consequently to lower the luminous efficacy. In view of that, it is necessary to use a weak acid incapable of dissolving the phosphor matrix, such as, an acid having a pKa of 2 or more at 25° C. Examples of the weak acid include hydrofluoric acid, acetic acid, carbonic acid and phosphoric acid. Among them, hydrofluoric acid is particularly preferred because it can remove $KMnO_4$ sufficiently without dissolving the phosphor matrix.

There are no particular restrictions on the concentration of the weak acid aqueous solution used for washing, but the concentration is normally 1 to 50 wt %, preferably 5 to 40 wt %.

In the method according to the embodiment, the phosphor washed with a weak acid is further subjected to rinse treatment by use of pure water and the like to remove the acid. This rinse treatment is carried out for the purpose of removing the remaining used weak acid from the surface of the phosphor. Further, if adopted as the weak acid, HF is preferably removed because it is harmful.

The procedures of separating the phosphor from the reaction solution, washing it with a weak acid and conducting the rinse treatment can be carried out, for example, on a filter installed in a filtration apparatus. Specifically, the reaction mother liquid is removed from the reaction mixture through the filter, and then phosphor particles remaining on the filter are subjected to the weak-acid washing by use of a weak acid aqueous solution. After the weak acid aqueous solution is removed, the rinse treatment can be carried out by use of pure water.

Figure 4:
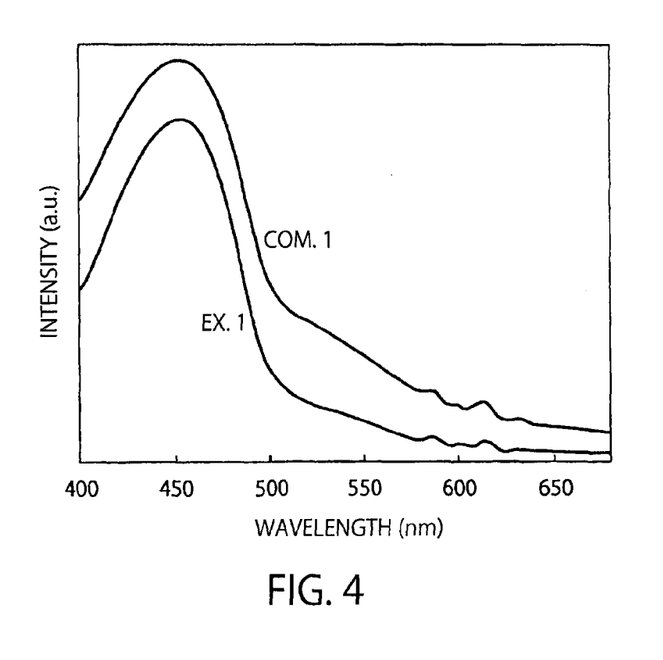
FIG. 4 shows the difference in absorption spectra between whether or not the phosphor is washed with a weak acid.

Absorption spectra of samples subjected and not subjected to the weak-acid washing with HF were measured. The results are shown in FIG. 4. Consequently, the sample washed with the weak acid was confirmed to have small absorption in the wavelength range of 600 to 650 nm, where the phosphor emits luminescence, and therefore found to be excellent in both internal and external quantum efficiencies. If having a light absorptivity of 10% or less, the phosphor of the embodiment can achieve excellent luminous efficacy.

The phosphor particles thus manufactured may be subjected to coating treatment to form a surface layer on the surface thereof so as to, for example, protect the phosphor from moisture or to improve coatability in producing the device. Material of the surface layer can be selected from silicone resin, epoxy resin, fluororesin, tetraethoxysilane (TEOS), silica, zinc silicate, aluminum silicate, calcium polyphosphate, silicone oil or silicon grease. The zinc silicate and aluminum silicate are represented by, for example, $ZnO \cdot cSiO_2$ ($1.5 \leq c \leq 4$) and $Al_2O_3 \cdot dSiO_2$ ($1 \leq d \leq 10$), respectively. The surface of the phosphor particles does not need to be completely coated with the surface layer, and may be partly bared. As long as provided on a part of the phosphor surface, the surface layer of the above material can work effectively even if the whole surface is not completely covered. The surface layer can be provided by immersing the phosphor particles in a dispersion or solution of the material and then drying them by heating or the like. In order to obtain the effect of the surface layer without damaging the essential function of the phosphor, the amount of the surface layer is preferably 0.1 to 5 vol % based on the phosphor particles.

After once the surface layer is formed on the phosphor particles in the above manner, the XPS spectrum of the phosphor in itself can no longer be obtained even if the phosphor particles are subjected to the XPS measurement. Accordingly, in order to measure the surface composition of the phosphor particles, it is necessary to conduct the measurement before the above surface treatment.

The phosphor particles of the embodiment may be classified with a sieve according to the coating method adopted for producing the light-emitting device. When the particle size is controlled with a sieve, the phosphor particles less undergo physical stress and hence the luminous properties thereof are less damaged. For producing a common white LED device, which adopts excitation light having an emission peak in the blue region, it is generally preferred to use the phosphor particles sieved to have a mean particle size of 1 to 50 µm. If the phosphor particles are sieved to be too small, the emission intensity may be lowered. On the other hand, if sieved to be too large, they may clog a nozzle of coating machine when the phosphor layer is formed in the LED device, so that the operational efficiency and production yield may be lowered and/or so that the resultant light-emitting device may exhibit light of uneven color.

The phosphor according to the embodiment of the present disclosure can be combined with a light-emitting element having an emission peak in the blue region, to obtain an LED light-emitting device of the embodiment. The LED light-emitting device according to the embodiment exhibits larger emission intensity than conventional devices employing $K_2SiF_6$:Mn red-light emitting phosphors.

Figure 5:
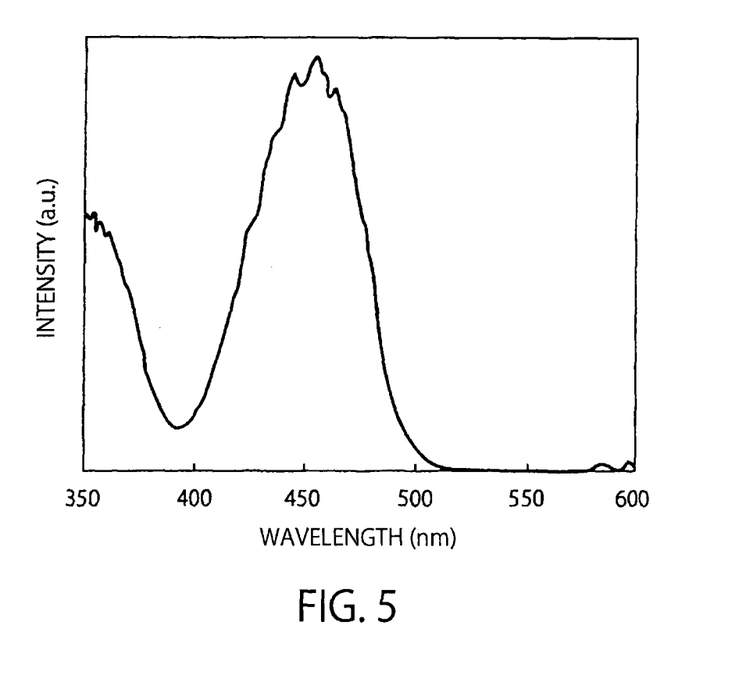
FIG. 5 shows an excitation spectrum of the phosphor according to the embodiment.

The phosphor of the embodiment can be excited by an excitation light source showing an emission peak in the blue to UV region. When the phosphor is used in the light-emitting device, the excitation light source is preferably a light-emitting element having an emission peak in the wavelength range of 440 to 470 nm inclusive. That is evident from FIG. 5, which is the excitation spectrum of the phosphor according to the embodiment. In view of the luminous efficacy, it is not preferred to use light-emitting elements having emission peaks out of the above range. Examples of the light-emitting element include solid-state light source elements such as LED chips and laser diodes.

The phosphor of the embodiment emits red luminescence, and therefore can be combined with green- or yellow-light emitting phosphors to obtain a white light-emitting device. What phosphors to use can be freely selected according to the purpose of the light-emitting device. For example, in the case of producing a white light-emitting device having a low color temperature, the phosphor of the embodiment is combined with a yellow-light emitting phosphor to obtain a device excellent in both efficacy and color rendering properties.

Green- or yellow-light emitting phosphors can be said to be phosphors having main emission peaks in the wavelength range of 520 to 570 nm inclusive. Examples of those phosphors include: silicate phosphors, such as, $(Sr,Ca,Ba)_2SiO_4$:Eu and $Ca_3(Sc,Mg)_2Si_3O_{12}$:Ce; sulfide phosphors, such as, $(Y,Gd)_3(Al,Ga)_5O_{12}$:Ce and $(Ca,Sr,Ba)Ga_2S_4$:Eu; and alkaline earth oxynitride phosphors, such as, $(Ca,Sr,Ba)Si_2O_2N_2$:Eu and $(Ca,Sr)$-αSiAlON. Here, the "main emission peaks" means the wavelengths at which the phosphors exhibit the largest emission intensities in their emission spectra. The emission peaks of the exemplified phosphors have been already reported in various references and the like. The emission peaks are often shifted within about 10 nm by small amounts of additive elements used in producing the phosphors or by slight fluctuation of the composition, but even the phosphors showing those shifted emission peaks are also included in the above exemplified phosphors.

According to the purpose, the light-emitting device employing the phosphor of the embodiment may further comprise blue green-, orange- and/or red-light emitting phosphors other than the above.

Examples of the orange- and red-light emitting phosphors include: silicate phosphors, such as, $(Sr,Ca,Ba)_2SiO_4$:Eu; tungstate phosphors, such as, $Li(Eu,Sm)W_2O_8$; oxysulfide phosphors, such as, $(La,Gd,Y)_2O_2S$:Eu; sulfide phosphors, such as, $(Ca,Sr,Ba)S$:Eu; and nitride phosphors, such as, $(Sr,Ba,Ca)_2Si_5N_8$:Eu and $(Sr,Ca)AlSiN_3$:Eu. Those can be employed in combination with the phosphor of the embodiment so as to manage not only the efficacy but also the color rendering properties for illumination use and the color gamut for backlight use. However, if too many phosphors are used, the light-emitting device may be impaired in the efficacy because of re-absorption phenomenon, in which one of the phosphors absorbs light emitted from another thereof, and/or because of scattering phenomenon, in which light emitted from one of the phosphors is scattered by others thereof.

Figure 6:
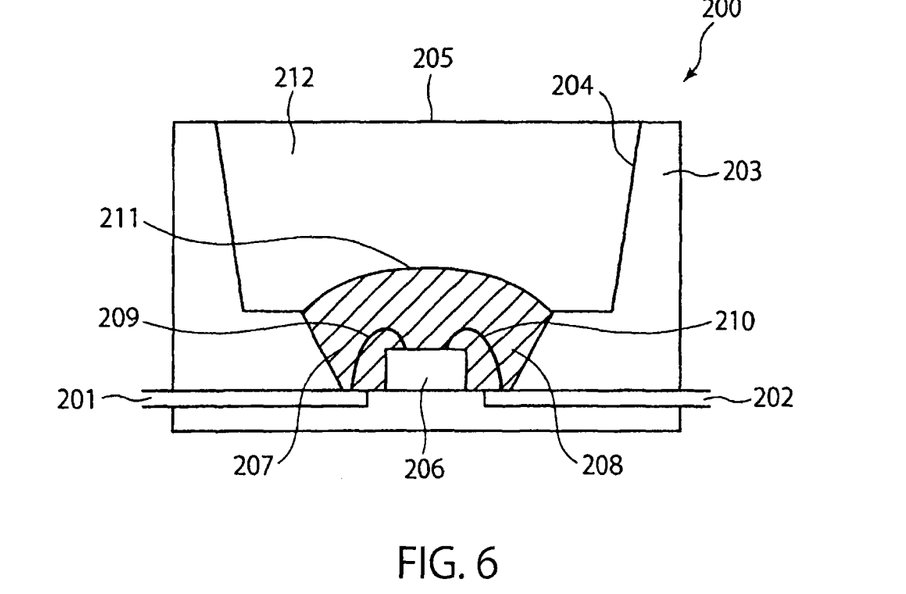
FIG. 6 shows a schematic sectional view of a light-emitting device according to an embodiment.

FIG. 6 shows a schematic sectional view of a light-emitting device according to one embodiment of the present disclosure.

The device shown in the Figure comprises a resin stem 200, leads 201 and 202, which are formed as a part of a lead frame, and also comprises a resin member 203, which is formed by integral molding with the lead frame. The resin member 203 has a concavity 205 in which the top opening is larger than the bottom. The inside wall of the concavity is coated with a reflective surface 204.

At the center of the nearly circular bottom of the concavity 205, there is a light-emitting chip 206 mounted with Ag paste or the like. The light-emitting chip 206 radiates, for example, UV or visible emission. Examples of the light-emitting chip 206 include GaAs type and GaN type semiconductor light-emitting diodes. The electrodes (not shown) of the light-emitting chip 206 are connected to the leads 201 and 202 by way of bonding wires 209 and 210 made of Au or the like, respectively. The positions of the leads 201 and 202 can be adequately modified.

In the concavity 205 of the resin member 203, there is a phosphor layer 207. In the phosphor layer 207, the phosphor 208 according to the embodiment is dispersed in a resin layer 211 made of, for example, silicone resin in an amount of 5 to 50 wt % inclusive. The phosphor can be fixed with various binders, such as, organic resin materials and inorganic glass materials.

The organic binder materials are preferably highly light-resistant transparent resins, such as, epoxy resin and acrylic resin as well as the silicone resin described above. The inorganic binder materials are preferably, for example, low melting point glass or the like made with alkaline earth borate; silica or alumina in the form of such fine particles that large particles of the phosphor can be fixed; and alkaline earth phosphate or the like obtained by sedimentation. Those binders can be used singly or in combination with two or more.

The phosphors used in the phoshpor layer may be subjected to surface-coating treatment, if necessary. The surface coating prevents the phosphors from deterioration caused by external factors, such as, heat, humidity and UV. Further, the treatment makes it possible to manage the dispersability of the phosphors so that the phosphor layer can be easily designed.

The light-emitting chip 206 may be of a flip chip type in which the n- and p-electrodes are placed on the same plane. This element can avoid troubles concerning the wires, such as disconnection or dislocation of the wires and light-absorption by the wires. In that case, therefore, it is possible to obtain a semiconductor light-emitting device excellent both in reliability and in luminance. Further, it is also possible to adopt a light-emitting chip 206 having an n-type substrate so as to produce a light-emitting device constituted as described below. In that device, an n-electrode is formed on the back surface of the n-type substrate while a p-electrode is formed on the top surface of a semiconductor layer laid on the substrate. The n- or p-electrode is mounted on one of the leads, and the p- or n-electrode is connected to the other lead by way of a wire, respectively. The size and kind of the light-emitting chip 206 and the dimension and shape of the concavity 205 can be properly changed.

Figure 7:
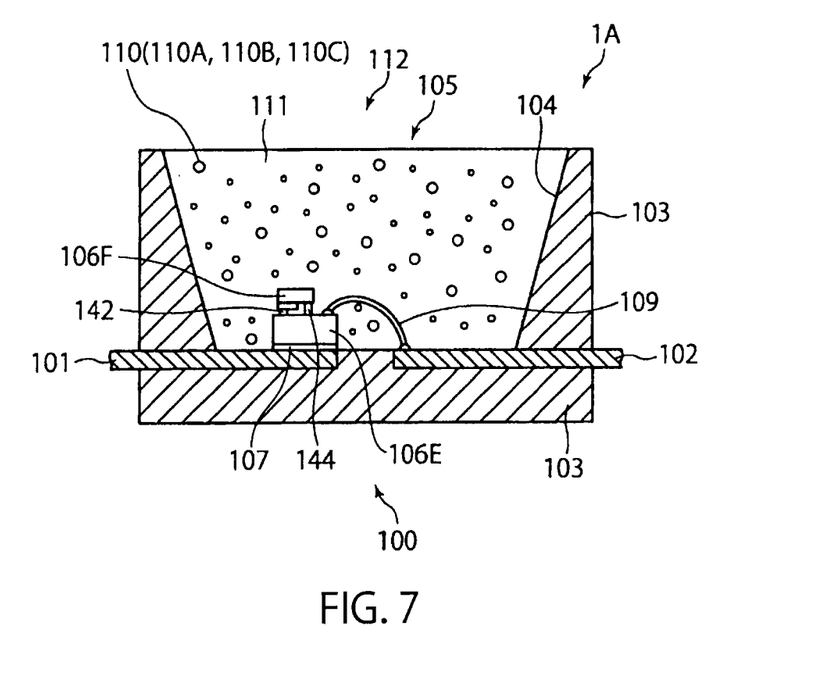
FIG. 7 shows a schematic sectional view of a light-emitting device according to another embodiment.

FIG. 7 shows a vertical sectional view schematically illustrating a light-emitting device according to another embodiment of the present disclosure. The device shown in the Figure comprises a resin stem 100, a semi-conductor light-emitting element 106F mounted thereon, and a sealant 111 covering the light-emitting element 106F. The light-emitting device 100 comprises leads 101 and 102, which are formed as a part of a lead frame, and also comprises a resin member 103, which is formed by integral molding with the lead frame. The leads 101 and 102 are so placed that the inner ends thereof are faced closely to each other. On the other hand, the outer ends of the leads 101 and 102 are oppositely extended to outside of the resin member 103.

The resin member 103 has an opening 105. On the bottom of the opening, there is a protective Zener diode 106E mounted with an adhesive 107. There is also a semiconductor light-emitting element 106F on the protective Zener diode 106E. Accordingly, the diode 106E is mounted on the lead 101, and is connected to the lead 102 by way of a wire 109.

The semi-conductor light-emitting element 106F is surrounded by the inside wall of the resin member 103, and the inside wall is inclined to the light-extraction direction and serves as a reflective surface 104, which reflects light. The opening 105 is filled with the sealant 111, which contains a phosphor 110. The light-emitting element 106F is placed on the protective Zener diode 106E. The phosphor of the embodiment is adopted as the phosphor 110.

Figure 8:
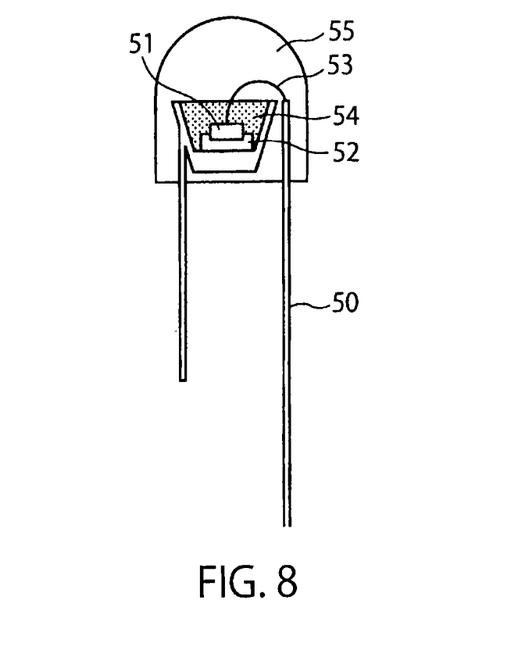
FIG. 8 shows a schematic sectional view of a light-emitting device according to still another embodiment.

FIG. 8 shows a schematic sectional view of a shell-type light-emitting device, in which a semi-conductor light-emitting element 51 is mounted on a lead 50' with a mount member 52 and covered with a predip material 54. The light-emitting element 51 is connected to a lead 50 by way of a wire 53, and is sealed with a casting material 55. The phosphor of the embodiment is contained in the predip material 54.

The light-emitting device, such as a white LED device, according the embodiment is suitably used for general illumination as described above, but is also favorably used in combination with filters such as color filters to serve as a lighting element such as a light source for backlighting of liquid crystal displays. Specifically, it can be adopted as an LED backlight light source or as a red-light emitting element employed in an inorganic electroluminescence device comprising a blue-light emitting layer.

The embodiments of the present disclosure will be further explained in detail by Examples and Comparative examples described below, but are by no means limited to the following Examples unless deviating from the scope and spirit of the disclosure.

EXAMPLES

Examples 1 to 3 and Comparative Examples 1 and 2

As a starting material, a commercially available Si single crystal was prepared. Independently, 10.8 g of $KMnO_4$ powder and 200 ml of an aqueous solution of HF (49%) were sufficiently mixed in 200 ml of a mixed solution, to prepare a reaction solution. In the reaction solution, the Si single crystal was made to react at room temperature (20° C.) for 80 minutes while the reaction solution was stirred slowly enough to be homogeneous. As a result, a phosphor was formed and then separated from the Si single crystal. The formed phosphor was subjected to weak-acid washing treatment by use of a HF aqueous solution (6 wt %), and subsequently washed with pure water to obtain a phosphor of Example 1. The obtained phosphor was subjected to quantitative analysis and thereby found to have a composition of $K_{2.1}(Si_{0.98}Mn_{0.02})F_{5.8}$. Further, the XRD measurement was carried out to obtain a diffraction pattern, from which the crystal structure was assigned to $K_2SiF_6$. Furthermore, the Mn content in the phosphor surface was found to be 0%.

Figure 9:
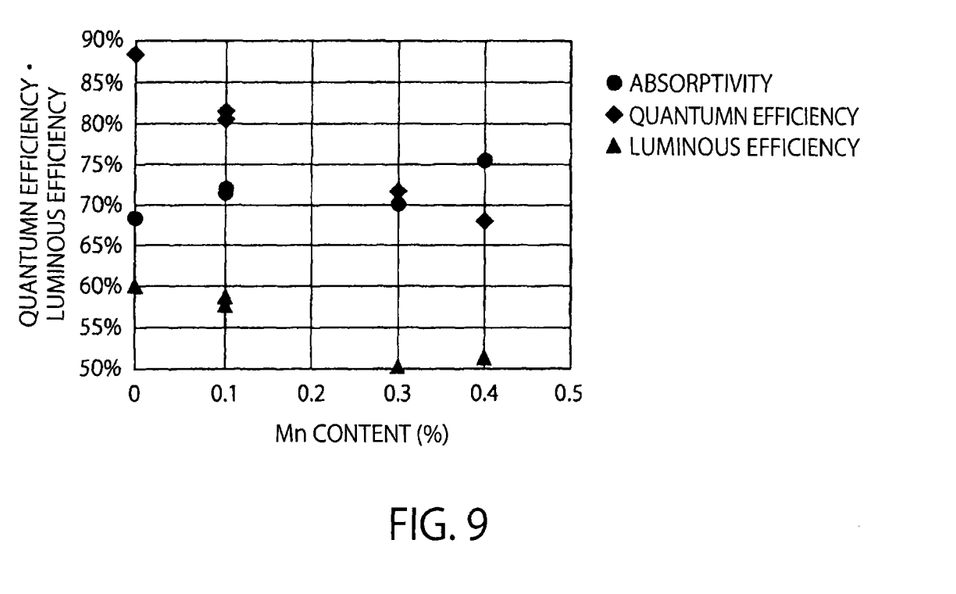
FIG. 9 shows the manganese contents on the surfaces, absorptivities, and internal and external quantum efficiencies of the phosphors produced in Examples and Comparative examples.

The procedure of Example 1 was repeated except for changing the concentration of the HF aqueous solution for washing and/or the times of washing, to produce phosphors of Examples 2 and 3 and Comparative examples 1 and 2. Table 1 and FIG. 9 show the Mn content on the surface, light absorptivity, and internal and external quantum efficiencies of each produced phosphor.

TABLE 1

| Sample | Relative light absorptivity | Relative internal quantum efficiency | Relative external quantum efficiency | Mn content (%) |
|---|---|---|---|---|
| EX. 1 | 100% | 100% | 100% | 0.0 |
| Ex. 2 | 105% | 92% | 97% | 0.1 |
| Ex. 3 | 105% | 91% | 96% | 0.1 |
| Com. 1 | 111% | 77% | 85% | 0.4 |
| Com. 2 | 103% | 81% | 84% | 0.3 |

Example 4 and Comparative Examples 3 to 5

The procedure of Example 1 was repeated except for changing the acid used in the weak-acid washing, to produce phosphors. The yield, quantum efficiency and luminous efficacy of each produced phosphor were measured in relative values based on those in Example 1. The results are shown in Table 2.

TABLE 2

| | Acid | Relative yield | Relative quantum efficiency | Relative luminous efficacy |
|---|---|---|---|---|
| Ex. 1 | HF | 1.000 | 1.000 | 1.000 |
| Ex. 4 | HF (concentration: half of Example 1) | 1.021 | 0.955 | 0.948 |
| Com. 3 | $HNO_3$ | 0.789 | 0.864 | 0.870 |
| Com 4 | $HNO_3$ (concentration: twice of Com. 3) | 0.641 | — | — |
| Com. 5 | $H_2SO_4$ | 0.757 | 0.867 | 0.733 |

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A red-light emitting phosphor particle, comprising potassium fluorosilicate and having a composition represented by the formula (A) at a surface thereof:

$$K_a SiF_b \quad (A),$$

where $1.5 \leq a \leq 2.5$ and $5.5 \leq b \leq 6.5$, wherein the red-light emitting phosphor particle is activated by manganese, the composition as a whole is represented by the formula (B):

$$K_c(Si_{1-x}, Mn_x)F_d \quad (B),$$

where $1.5 \leq c \leq 2.5$, $5.5 \leq d \leq 6.5$ and $0 < x \leq 0.06$ a total of an amount of manganese present on a superficial face of the red-light emitting phosphor particle and an area under the superficial face reachable by the X-ray photoelectron spectroscopy with the following conditions is not more than 0.2 mol % based on the total amount of all elements on the surface:

X-ray source: AlKα line,
power: 40 W,
measuring area: Φ 200 μm,
pass energy:
   wide scan: 187.85 eV (1.60 eV/step)
   narrow scan: 58.70 eV (0.125 ev/step),
charge neutralization gun: e⁻ in use with Ar⁺, and
takeoff angle: 45°, the amounts of oxygen and fluorine in the red-light emitting phosphor particle satisfy [oxygen content]/[(fluorine content)+(oxygen content)]<0.05, and the red-light emitting phosphor particle has an internal quantum efficiency η' of 60% or more, where the internal quantum efficiency if is calculated by the formula (II):

$$\text{internal quantum efficiency}(\eta') = \frac{\left(\int \lambda \cdot [P(\lambda)]d\lambda\right)}{\left(\int \lambda \cdot [E(\lambda) - R(\lambda)]d\lambda\right)} \quad (II)$$

wherein $E(\lambda)$ is the whole spectrum of light emitted by an excitation light source onto the red-light emitting phosphor particle in terms of number of photons, $R(\lambda)$ is the spectrum of light emitted by the excitation light source and reflected by the red-light emitting phosphor particle in terms of the number of photons, and $P(\lambda)$ is the emission spectrum of the red-light emitting phosphor particle in terms of the number of photons.

2. The red-light emitting phosphor particle according to claim 1, having a light absorptivity of 10% or less in the wavelength range of from 600 nm to 650 nm.

3. A method for manufacturing the red-light emitting phosphor particle according to claim 2, comprising:
   immersing a silicon source in a reaction solution comprising potassium permanganate and hydrogen fluoride such that the silicon source is reacted with the reaction solution and that a crystal is formed;
   separating the crystal from the reaction solution;
   washing the crystal with a weak acid after the separating; and
   subjecting the crystal to rinse treatment after the washing.

4. A light-emitting device, comprising:
   a light-emitting element radiating light in the wavelength range of from 440 nm to 470 nm; and
   a phosphor layer comprising the red-light emitting phosphor particle according to claim 2.

5. The light-emitting device according to claim 4, wherein the phosphor layer further comprises an orange- or red-light emitting phosphor particle.

6. A method for manufacturing the red-light emitting phosphor particle according to claim 1, comprising:
   immersing a silicon source in a reaction solution comprising potassium permanganate and hydrogen fluoride such that the silicon source is reacted with the reaction solution and that a crystal is formed;
   separating the crystal from the reaction solution;

washing the crystal with a weak acid after the separating; and subjecting the crystal to rinse treatment after the washing, wherein the reaction solution comprises potassium permanganate and hydrogen fluoride in a molar ratio of from 1/200 to 1/40.

7. The method according to claim 6, wherein, in the immersing, the silicon source is immersed in the reaction solution for 20 minutes to 80 minutes.

8. The method according to claim 6, wherein the weak acid is at least one selected from the group consisting of hydrofluoric acid, acetic acid, carbonic acid and phosphoric acid.

9. The method according to claim 6, wherein the silicon source is at least one selected from the group consisting of single crystal silicon, polycrystal silicon, amorphous silicon, crystalline silicon dioxide and amorphous silicon dioxide.

10. The method according to claim 6, wherein the silicon source is a silicon substrate.

11. The method according to claim 6, wherein the reaction solution comprises potassium permanganate in an amount of 1 wt % or more.

12. A light-emitting device, comprising:
a light-emitting element radiating light in the wavelength range of from 440 nm to 470 nm; and
a phosphor layer comprising the red-light emitting phosphor particle according to claim 1.

13. The light-emitting device according to claim 12, wherein the phosphor layer further comprises a green-light emitting phosphor particle having a main emission peak in the wavelength range of from 520 nm to 570 nm.

14. The light-emitting device according to claim 12, wherein the phosphor layer further comprises a green- or yellow-light emitting phosphor particle.

15. The light-emitting device according to claim 14, wherein the green- or yellow-light emitting phosphor particle is at least one selected from the group consisting of $(Sr,Ca,Ba)_2SiO_4$:Eu, $Ca_3(Sc,Mg)_2Si_3O_{12}$:Ce, $(Y,Gd)_3(Al,Ga)_5O_{12}$:Ce, $(Ca,Sr,Ba)Ga_2S_4$:Eu, $(Ca,Sr,Ba)Si_2O_2N_2$:Eu and $(Ca,Sr)$-$\alpha$SiAlON.

16. The light-emitting device according to claim 12, wherein the phosphor layer further comprises an orange- or red-light emitting phosphor particle.

17. The light-emitting device according to claim 16, wherein the orange- or red-light emitting phosphor particle is at least one selected from the group consisting of $(Sr,Ca,Ba)_2SiO_4$:Eu, $Li(Eu,Sm)W_2O_8$, $(La,Gd,Y)_2O_2S$:Eu, $(Ca,Sr,Ba)S$:Eu, $(Sr,Ba,Ca)_2Si_5N_8$:Eu, and $(Sr,Ca)AlSiN_3$:Eu.

* * * * *